United States Patent
Komori (10) Patent No.: US 10,975,495 B2
(45) Date of Patent: Apr. 13, 2021

(54) EPITAXIAL GROWTH APPARATUS, PREHEAT RING, AND METHOD OF MANUFACTURING EPITAXIAL WAFER USING THESE

(71) Applicant: SUMCO CORPORATION, Tokyo (JP)

(72) Inventor: Haku Komori, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 5 days.

(21) Appl. No.: 16/482,800

(22) PCT Filed: Mar. 1, 2018

(86) PCT No.: PCT/JP2018/007889
§ 371 (c)(1),
(2) Date: Aug. 1, 2019

(87) PCT Pub. No.: WO2018/163975
PCT Pub. Date: Sep. 13, 2018

(65) Prior Publication Data
US 2020/0354853 A1 Nov. 12, 2020

(30) Foreign Application Priority Data

Mar. 7, 2017 (JP) .............................. JP2017-043202

(51) Int. Cl.
*C30B 25/14* (2006.01)
*C30B 25/10* (2006.01)
(Continued)

(52) U.S. Cl.
CPC .............. *C30B 25/14* (2013.01); *C30B 25/10* (2013.01); *C30B 25/12* (2013.01); *C30B 35/007* (2013.01); *H01L 21/68714* (2013.01)

(58) Field of Classification Search
CPC .......... C30B 25/14; C30B 25/10; C30B 25/12
See application file for complete search history.

(56) References Cited

U.S. PATENT DOCUMENTS

2012/0103263 A1* 5/2012 Myo ................ H01L 21/68792
118/728
2013/0319319 A1* 12/2013 Ohnishi ............ H01L 21/68735
117/88

(Continued)

FOREIGN PATENT DOCUMENTS

JP 7-78863 3/1995
JP 2007-326761 12/2007
(Continued)

OTHER PUBLICATIONS

Office Action (Notice of Reasons for Refusal) in Japanese Patent Appl. No. 2017-043202, dated Jan. 12, 2018, dated Jan. 16, 2018; and English-language translation thereof.

(Continued)

*Primary Examiner* — Errol V Fernandes
(74) *Attorney, Agent, or Firm* — Greenblum & Bernstein, P.L.C.

(57) ABSTRACT

An epitaxial growth apparatus that can provide an improved thickness uniformity of an epitaxial film is provided. An epitaxial growth apparatus in accordance with the present disclosure includes a susceptor and a preheat ring surrounding a side of the susceptor having a gap interposed therebetween. A width of the gap at least in part between the susceptor and the preheat ring is set to be longer than a width $w_1$ of the gap between the susceptor and the preheat ring in the vicinity of the reactant gas inlet.

11 Claims, 6 Drawing Sheets (51) Int. Cl.
*C30B 25/12* (2006.01)
*C30B 35/00* (2006.01)
*H01L 21/687* (2006.01)

(56) References Cited

U.S. PATENT DOCUMENTS

2015/0037017 A1 2/2015 Lau et al.
2015/0075430 A1 3/2015 Shah et al.

FOREIGN PATENT DOCUMENTS

| JP | 2016-530730 | 9/2016 |
| JP | 2016-533033 | 10/2016 |
| KR | 10-2004-0077746 A | 9/2004 |
| WO | 2005/124845 | 12/2005 |

OTHER PUBLICATIONS

International Search Report issued in International Patent Application No. PCT/JP2018/007889, dated Apr. 3, 2018.
International Preliminary Report on Patentability for International Patent Application No. PCT/JP2018/007889, dated Sep. 10, 2019.
Office Action for KR App. No. 10-2019-7022406, dated Nov. 25, 2020 (w/ translation).

* cited by examiner

EPITAXIAL GROWTH APPARATUS, PREHEAT RING, AND METHOD OF MANUFACTURING EPITAXIAL WAFER USING THESE

TECHNICAL FIELD

The present disclosure relates to an epitaxial growth apparatus, a preheat ring for use in the apparatus, and a method of manufacturing an epitaxial wafer using these.

BACKGROUND

An epitaxial wafer is a semiconductor wafer having an epitaxial film grown in a vapor phase on its surface. For example, when extremely high crystal perfection or a multilayered structure having layers of various resistivities is required, a monocrystalline silicon thin film is grown on a silicon wafer in a vapor phase (epitaxially) to prepare an epitaxial silicon wafer.

Figure 1:
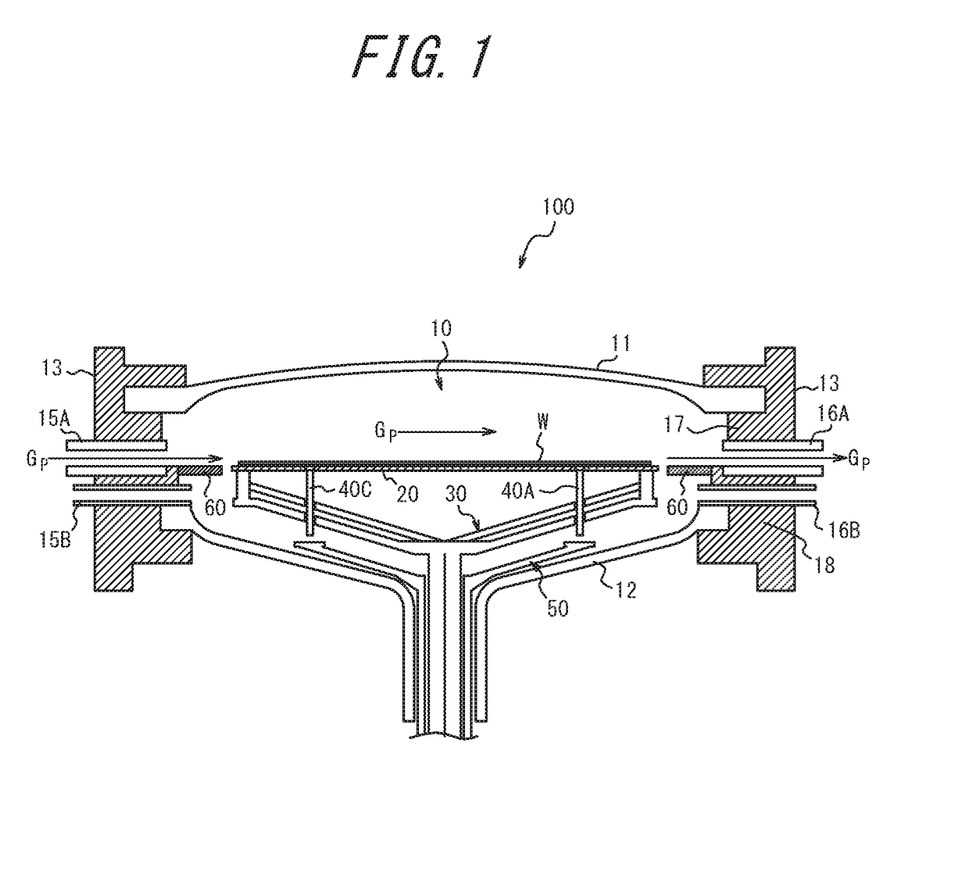
FIG. 1 is a cross-sectional view of an epitaxial growth apparatus according to prior art.

Upon manufacturing epitaxial wafers, a single-substrate epitaxial growth apparatus is used, for example. Here, referring to FIG. 1, a typical single-substrate epitaxial growth apparatus will be described. As depicted in FIG. 1, an epitaxial growth apparatus 100 includes a chamber 10 including an upper dome 11, a lower dome 12, and a dome base 13, wherein the chamber 10 defines an epitaxial film formation chamber. The dome base 13 has an upper liner 17 and a lower liner 18, wherein a susceptor defines the border between them. The chamber 10 is also provided with a reactant gas inlet 15A and a reactant gas outlet 16A on the side of the chamber 10 on the upper liner 17 side for supplying and discharging a reactant gas $G_P$, respectively, such that they oppose to each other. The chamber 10 is further provided with an atmospheric gas inlet 15B and an atmospheric gas outlet 169 on the side of the chamber 10 on the lower liner 18 side for supplying and discharging an atmospheric gas $G_A$, thereby maintaining the lower dome 12 part of the chamber 10 in hydrogen atmosphere, respectively, such that they oppose to each other.

Inside the chamber 10, a susceptor 20 for mounting a silicon wafer W is installed. The susceptor 20 is supported by a susceptor support shaft 30 from below. The susceptor support shaft 30 engages with the bask-side outer periphery of the susceptor 20 with three supporting pins (not illustrated) at the end of an arm, thereby supporting the susceptor 20. The susceptor 20 further has three through-holes (one of which is not illustrated) formed therein, and the arm of the susceptor support shaft 30 also has corresponding through-holes. Lift pins 40A, 40B, and 40C (the lift pin 40B is not illustrated in the schematic cross-sectional view of FIG. 1 because of its position) pass through the through-holes in the arm and the through-holes in the susceptor. The bottom ends of the lift pins 40 are configured to be supported by a lift shaft 50. For supporting a semiconductor wafer W transferred to the chamber 10, mounting the semiconductor wafer W on the susceptor 20, or transferring the epitaxial wafer out of the chamber 10 subsequent to an epitaxial vapor growth, the lift pins 40 are moved upward or downward through the through-holes in the arm and the through-holes in the susceptor in conjunction with an upward or downward movement of the lift shaft 50, thereby the top ends of the lift pins 40 transfers the semiconductor wafer W upward or downward. Upon a formation of an epitaxial film in this single-substrate epitaxial growth apparatus, the front surface of the semiconductor wafer W mounted on the susceptor 20 is made to contact a reactant gas $G_P$ while the susceptor 20 rotates. Note that the term "reactant gas" refers to a gas including source gas(es) mixed with a carrier gas. For a formation of a silicon epitaxial layer as an epitaxial layer, a silicon source gas, such as trichlorosilane gas, is used as the source gas.

Here, the side of the susceptor 20 is surrounded by the preheat ring 60 having a gap interposed of about 3 mm, in general, between the susceptor 20 and the preheat ring 60. The preheat ring 60 is also referred as a warm-up ring or preheating ring, and the preheat ring 60 preheats the reactant gas $G_P$ before the reactant gas $G_P$ is introduced to the epitaxial film formation chamber and contacts the semiconductor wafer W. The preheat ring 60 also preheats the susceptor 20. In this manner, the preheat ring 60 improves the thermal uniformities of the susceptor 20 and the semiconductor wafer before and during a film formation.

Conventional preheat rings have ring shapes in top view which are center-symmetric about the center point of the susceptor. One of the reasons of the center-symmetry is to prevent a contact of a susceptor and a preheat ring while the susceptor rotates during a formation of an epitaxial layer, as described above. Further, for an improved thermal uniformity of the semiconductor before and during a film formation, a preheat ring having a center-symmetric structure about the center of a semiconductor wafer or a susceptor has been considered preferred.

Patent Literature 1 (PTL 1) discloses an epitaxial growth apparatus including a preheating ring (preheat ring) that surrounds the periphery of a susceptor, and is configured to heat a reactant gas while the reactant gas flows from a gas inlet to a gas outlet.

CITATION LIST

Patent Literature

PTL 1: JP 07-078863 A

SUMMARY

Technical Problem

In the meantime, determinations of thickness profiles of epitaxial layers formed with a single-substrate epitaxial growth apparatus have revealed deviations in thickness profiles. Since further size reductions of semiconductor devices are expected to continue in coming years, techniques that can provide an improved thickness uniformity of an epitaxial layer is in need.

It is an object of the present disclosure, therefore, to provide an epitaxial growth apparatus that can provide an improved thickness uniformity of an epitaxial layer.

We have made strenuous efforts to find possible causes of such deviations in thickness profiles. Even when a susceptor and a semiconductor wafer are positioned precisely, the centers of the susceptor and the semiconductor wafer are displaced with respect to the center axis of a single-substrate epitaxial growth apparatus in the order of micrometers. As a result, the width of the gap (gap width) between the preheat ring and the susceptor deviates while the susceptor rotates, which causes an inhomogeneous flow of the reactant gas. We have considered that such an inhomogeneous flow of the reactant gas causes a deviation in the thickness profile of an epitaxial layer. We also have found that a fluctuation in a blowup of the atmospheric gas $G_A$ in the gap between the preheat ring and the susceptor in the vicinity of the reactant gas inlet 15A caused an inhomogeneous contact of the reactant gas $G_P$ to the front surface of the semiconductor wafer W, which particularly compromises the thickness uniformity of an epitaxial layer.

Figure 2:
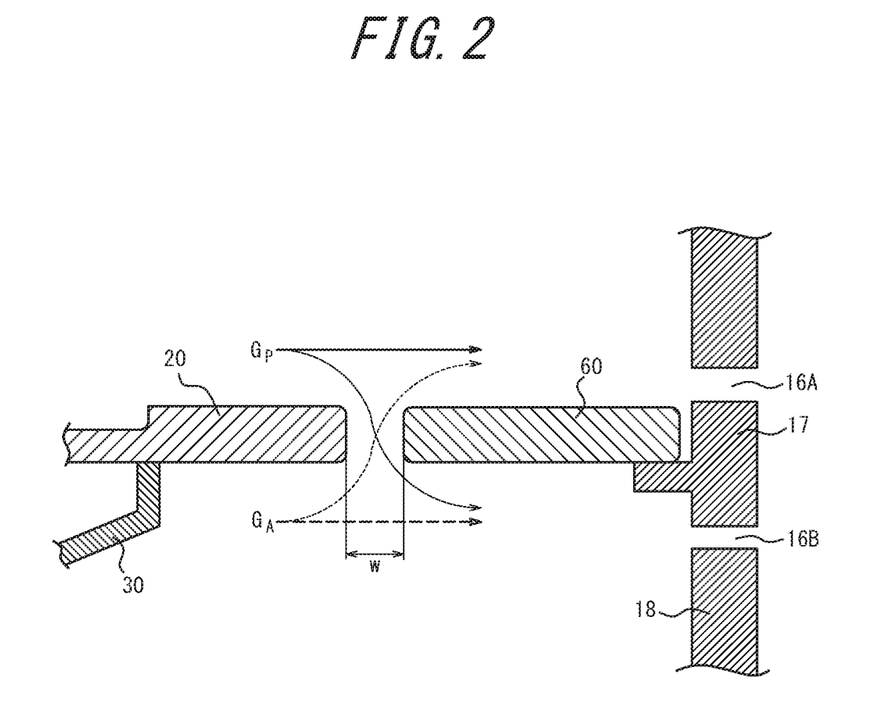
FIG. 2 is a schematic cross-sectional view illustrating flows of gases in the vicinities of gas outlets in an epitaxial growth apparatus, found in our study.

Here, referring to FIG. 2, flows of a reactant gas $G_P$ and an atmospheric gas $G_A$ in the vicinity of the reactant gas outlet 16A and in the vicinity of the atmospheric gas outlet 16B will be described schematically. Most of the reactant gas $G_P$ flows toward the reactant gas outlet 16A, but some flows through the gap between the susceptor 20 and the preheat ring 60 and sinks in the vicinity of the atmospheric gas outlet 16B. In contrast, most of the atmospheric gas $G_A$ flows toward the atmospheric gas outlet 16B, but some blows up through the gap between the susceptor 20 and the preheat ring 60 in the vicinity of the reactant gas outlet 16A. This phenomenon is generally caused by the pressure difference between the upper dome part and the lower dome part of the chamber 10.

We have considered that intensifying a blowup of the atmospheric gas $G_A$ intentionally in the gap between the preheat ring 60 and the susceptor 20 in the vicinity of the reactant gas outlet 16A may contribute to reduce a blowup of the atmospheric gas $G_A$ in the vicinity of the reactant gas inlet 15A described above. This relatively reduces a fluctuation in a blowup of the atmospheric gas $G_A$ in the vicinity of the inlet 15A. We have considered that the blowup of the atmospheric gas $G_A$ in the vicinity of the outlet 16A can be intensified by increasing the gap width w between the preheat ring 60 and the susceptor 20 as compared to the gap width in the vicinity of the inlet, for example.

We have made further strenuous efforts. For generating a blowup of the atmospheric gas $G_A$ in the vicinity of the outlet 16A, a gap that is longer than the gap width between the susceptor 20 and the preheat ring 60 on the supply side of the reactant gas $G_P$, is provided at least in part between the susceptor 20 and the preheat ring 60, which contributes to reduce a blowup in the vicinity of the inlet 15A. We found that such an epitaxial growth apparatus provides solutions to the aforementioned issues, and the present disclosure thus has been attained.

Solution to Problem

In other words, the subject matter of the present disclosure is as follows:

(1) An epitaxial growth apparatus used for a vapor phase growth of an epitaxial film on a surface of a semiconductor wafer, the epitaxial growth apparatus comprising:
a chamber,
a susceptor for mounting the semiconductor wafer inside the chamber;
a preheat ring surrounding a side of the susceptor having a gap interposed therebetween; and
a reactant gas inlet for supplying a reactant gas for the vapor phase growth of an epitaxial layer, to a front surface of the semiconductor wafer,
wherein a width of the gap at least in part between the susceptor and the preheat ring is set to be longer than the width of the gap between the susceptor and the preheat ring in a vicinity of the reactant gas inlet.

(2) The epitaxial growth apparatus according to the aforementioned (1), wherein the width of the gap between the susceptor and the preheat ring in a vicinity of an opposite side to the reactant gas inlet is longer than the width of the gap between the susceptor and the preheat ring in the vicinity of the reactant gas inlet.

(3) The epitaxial growth apparatus according to the aforementioned (1) or (2), wherein a difference between outer and inner diameters of the preheat ring varies radially around the preheat ring, (4) The epitaxial growth apparatus according to the aforementioned (3), wherein outer and inner circumferences of the preheat ring have circular shapes of different diameters, and center points of the outer and inner circumferences do not coincide with each other.

(5) The epitaxial growth apparatus according to the aforementioned (4), an angle about the center point of the outer circumference between a point closest to the reactant gas inlet and a position where the width of the gap is the shortest is no smaller than −40° and less than 0° where angles in a direction of a rotation of the susceptor are defined as positive angles.

(6) The epitaxial growth apparatus according to the aforementioned (3), wherein the inner circumference of the preheat ring is provided with a notch.

(7) The epitaxial growth apparatus according to the aforementioned (3), wherein the outer circumference of the preheat ring has a circular shape, and the inner circumference of the preheat ring has an elliptic shape.

(8) The epitaxial growth apparatus according to any of the aforementioned (1)-(7), wherein the preheat ring has an annular structure, (9) A preheat ring for surrounding a side of a susceptor for mounting a semiconductor wafer, having a gap interposed between the preheat ring and the susceptor, inside an epitaxial growth apparatus,
wherein a difference between outer and inner diameters of the preheat ring varies radially around the preheat ring.

(10) The preheat ring according to the aforementioned (9), wherein outer and inner circumferences of the preheat ring have circular shapes of different diameters, and center points of the outer and inner circumferences do not coincide with each other.

(11) The preheat ring according to the aforementioned (10), wherein an angle about a center of the outer circumference between a point closest to the reactant gas inlet and a position where the width of the gap is the shortest is no smaller than −40° and less than 0° where angles in a direction of a rotation of the susceptor are defined as positive angles.

(12) The preheat ring according to the aforementioned (9), wherein the inner circumference of the preheat ring is provided with a notch.

(13) The preheat ring according to the aforementioned (9), wherein the outer circumference of the preheat ring has a circular shape, and the inner circumference of the preheat ring has an elliptic shape.

(14) The preheat ring according to any one of the aforementioned (9)-(13), wherein the preheat ring has an annular structure.

(15) A method of manufacturing an epitaxial wafer comprising: supplying an atmospheric gas and a reactant gas containing hydrogen gas as a carrier gas to the epitaxial growth apparatus according to any one of the aforementioned (1)-(8) or an epitaxial growth apparatus comprising the preheat ring according to any one of or the aforementioned (9)-(14).

Advantageous Effect

In accordance with the present disclosure, an epitaxial growth apparatus that can provide an improved thickness uniformity of an epitaxial film is provided.

DETAILED DESCRIPTION

Hereinafter, lift pins of the present disclosure will be described in detail with reference to the drawings. Note that the aspect ratios of some elements in the drawings are exaggerated, and thus the elements may not be drawn to scale.

(Epitaxial Growth Apparatus)

An epitaxial growth apparatus according to an embodiment of the present disclosure grows an epitaxial film in a vapor phase on a surface of a semiconductor wafer W. Here, an epitaxial growth apparatus 100 includes a chamber 10, a susceptor 20 for mounting a semiconductor wafer inside the chamber 10, a preheat ring 60 surrounding the side of the susceptor 20 having a gap interposed therebetween, and a reactant gas inlet 15A for supplying a reactant gas $G_P$ for a vapor phase growth of an epitaxial layer to the front surface of the semiconductor wafer W. Unlike prior art, as exemplified in FIG. 3, in the epitaxial growth apparatus 100 according to this embodiment, a width $w_2$ of the gap at least in part between the susceptor 20 and the preheat ring 60 is longer than a width $w_1$ of the gap between the susceptor 20 and the preheat ring 60 in the vicinity of the reactant gas inlet 15A. Details of those elements will be described below in sequence.

<Chamber>

The chamber 10 includes an upper dome 11, a lower dome 12, and a dome base 13, wherein the chamber 10 defines an epitaxial film formation chamber. Generally, the chamber 10 is also provided with the reactant gas inlet 15A and a reactant gas outlet 16A on the side of the chamber 10 on the upper liner 17 side for supplying and discharging the reactant gas $G_P$, respectively, such that they oppose to each other. Generally, the chamber 10 is further provided with an atmospheric gas inlet 15B and an atmospheric gas outlet 16B on the side of the chamber 10 on the lower liner 18 side for supplying and discharging an atmospheric gas $G_A$, respectively, such that they are angled to each other. The inlets and the outlets of the reactant gas $G_P$ and the atmospheric gas $G_A$ are depicted as being located on the same cross-sectional plain in FIG. 1 for the sake of simplicity, and the inlets for the reactant gas $G_P$ and the atmospheric gas $G_A$ may be positioned in parallel to each other as in FIG. 1.

<Susceptor>

The susceptor 20 is a disk-shaped member for mounting the semiconductor wafer W inside the chamber 10. Generally, the susceptor 20 has three through-holes that extend vertically from the front surface to the back surface, and are radially spaced apart from each other at an angle of 120°. Lift pins 40A, 40B, and 40C are configured to be through respective through-holes. The susceptor 20 may be used which has a thickness of about 2-8 mm and is made from carbon graphite as a base material and is coated with silicon carbide (SiC) of a Vickers hardness of 2,346 kgf/mm² on the surface thereof. In the surface of the susceptor 20, a step (not illustrated) for receiving and supporting the semiconductor wafer W is provided.

<Preheat Ring>

The preheat ring 60 surrounds the side of the susceptor 20 having a gap interposed therebetween. The preheat ring 60 preheats the reactant gas $G_P$ before the reactant gas $G_P$ is heated by light emitted from an unillustrated halogen lamp, is introduced to the epitaxial film formation chamber, and contacts the semiconductor wafer W. The preheat ring 60 also preheats the susceptor 20. In this manner, the preheat ring 60 improves the thermal uniformities of the susceptor 20 and the semiconductor wafer before and during a film formation.

Similarly to the susceptor 20, the preheat ring 60 may be used which is made from carbon graphite as a base material and is coated with silicon carbide (SiC) of a Vickers hardness of 2,346 kgf/mm² on the surface. The preheat ring 60 may have a thickness that is the same as or greater than the thickness of the susceptor 20, and may have a thickness of 2-6 mm, for example. Preferably, the preheat ring 60 is placed horizontally, but a gradient of about ±1 degree with respect to the horizon is allowable.

Figure 3:
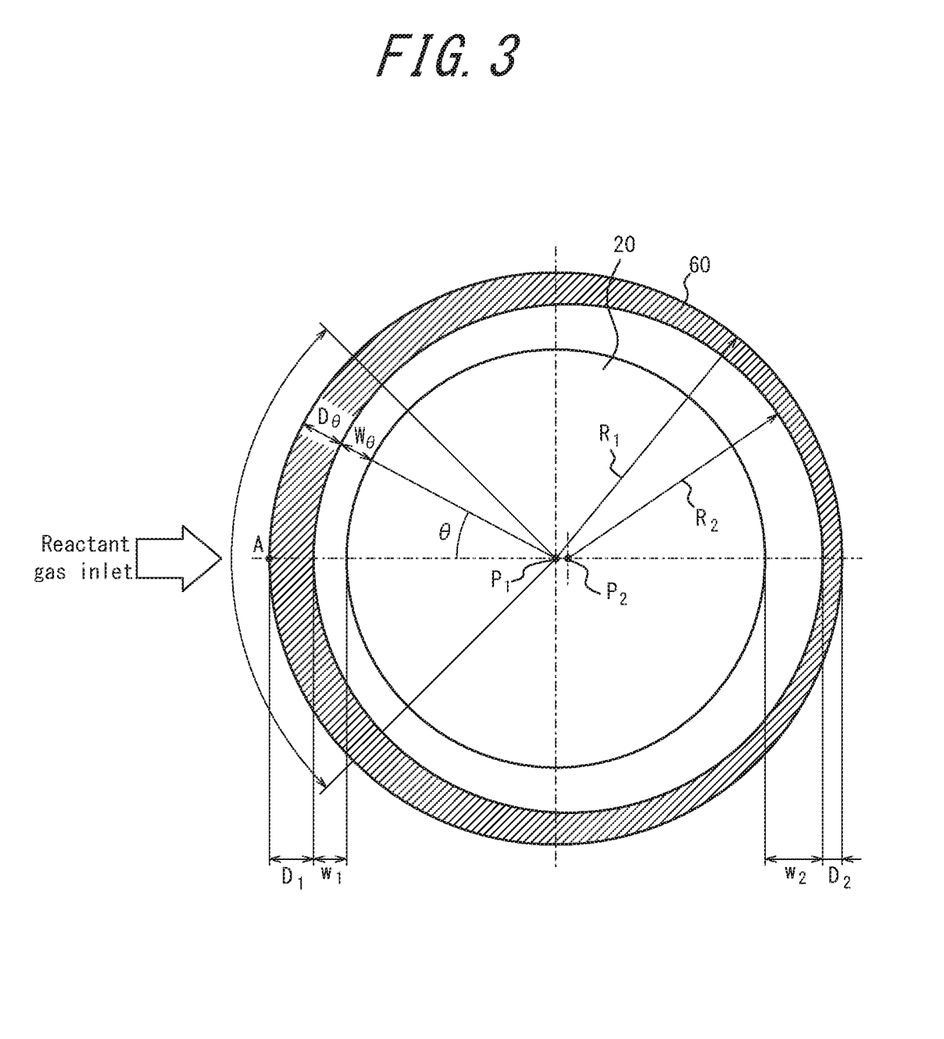
FIG. 3 is a schematic plan view illustrating an exemplary positional relationship of a susceptor and a preheat ring in the epitaxial growth apparatus according to an embodiment of the present disclosure.

The width of the gap between the susceptor 20 and the preheat ring 60 in this specification will be described with reference to FIG. 3. Here, from the base point A of the preheat ring 60 which is the point the closest to the reactant gas inlet, the width of the gap between the susceptor 20 and the preheat ring 60 at a position shifted clockwise by θ degrees about the center point $P_1$ of the outer circumference of the preheat ring 60, is defined as $w_θ$. As depicted in FIG. 3, the gap widths on the upstream ($w_{0°}$) and upstream ($w_{180°}$) of the flow of the reactant gas from the base point A are particularly defined as $w_1$ and $w_2$, respectively. In the example in FIG. 3, the gap width $w_2$ at the position opposite to the reactant gas inlet, i.e., on the downstream of the flow of the reactant gas, is the longest gap width, while the gap width $w_1$ on the upstream is the shortest gap width. In general, as used herein, the term "in the vicinity of the reactant gas inlet of the preheat ring 60" refer to a region defined by shifting the position A where the distance between the preheat ring 60 and the reactant gas inlet 15A clockwise and counterclockwise by ±45 degrees about the center point $P_1$ of the outer circumference, although this definition varies depending on the shape of the preheat ring 60 and the location of the reactant gas inlet. Generally, the reactant gas $G_P$ is introduced on the upstream and flows to the downstream in the direction indicated by the arrow in the drawing although it may be affected by the centrifugal force induced by rotations of the susceptor 20.

Further, similarly to the gap widths described above, as depicted in FIG. 3, the outer-inner diameter difference (difference between the outer diameter and the inner diameter) of the preheat ring 60 at the position shifted clockwise by θ degrees about the center point $P_1$ of the outer circumference of the preheat ring 60, is denoted as $D_θ$. Further, the outer-inner diameter difference of the preheat ring 60 on the upstream ($D_{0°}$) and the upstream ($D_{180°}$) of the flow of the reactant gas are particularly denoted as $D_1$ and $D_2$, respectively.

In this embodiment, except for a part of the preheat ring 60 in the vicinity of the reactant gas inlet, a gap longer than the gap width between the susceptor 20 and the preheat ring 60 in the vicinity of the reactant gas inlet 15A, is provided at least in part between the susceptor 20 and the preheat ring 60. The technical significance of this configuration will be described below.

An inhomogeneous contact of the reactant gas $G_P$ to the front surface of the semiconductor wafer W in the vicinity of the reactant gas inlet 15A can be reduced by reducing a blowup of the atmospheric gas $G_A$ in the vicinity of the reactant gas inlet 15A. A reduction of such a blowup is achieved by intentionally intensifying a blowup of the atmospheric gas $G_A$ in the gap between the preheat ring 60 and the susceptor 20 in the vicinity of the reactant gas outlet 16A, as described with reference to FIG. 2, for example. Alternatively, a blowup of the atmospheric gas $G_A$ in the vicinity of the reactant gas inlet 15A can also be reduced by intentionally intensifying a blowup of the atmospheric gas $G_A$ in regions other than the vicinity of the reactant gas outlet 16A, except for the vicinity of the reactant gas inlet 15A.

Thus, by providing a longer gap width at least in part between the susceptor 20 and the preheat ring 60 than the gap width between the susceptor 20 and the preheat ring 60 in the vicinity of the reactant gas inlet 15A, a blowup of the atmospheric gas $G_A$ in the vicinity of the reactant gas inlet 15A is reduced, which contributes to reduce an inhomogeneous contact of the reactant gas $G_P$ to the front surface of semiconductor wafer W. As a result, the thickness uniformity of an epitaxial layer formed with the epitaxial growth apparatus 100 according to this embodiment can be improved.

For that purpose, preferably, the gap width between the susceptor 20 and the preheat ring 60 in the vicinity opposite to the reactant gas inlet (i.e., in the vicinity of the reactant gas outlet) is set to be longer than the gap width between the susceptor and the preheat ring in the vicinity of the reactant gas inlet. Particularly preferably, the gap width between the susceptor 20 and the preheat ring is the shortest in the vicinity of the reactant gas inlet, and the gap width between the susceptor and the preheat ring in the vicinity of the reactant gas inlet is preferably reduced gradually toward the region opposite to the reactant gas inlet. Further, the outer-inner diameter difference of the preheat ring 60 preferably varies radially.

Referring to FIGS. 3 and 4A-4C, specific examples that provide gap widths as described above will be described. Shapes of the preheat ring 60 applicable to this embodiment, however, are not limited to the following examples.

As depicted in FIG. 3, preferably, the outer and inner circumferences of the preheat ring 60 have circular shapes of different diameters, and the center point $P_1$ of the outer circumference and the center point $P_2$ of the inner circumference do not coincide with each other. The latter can also be said that the outer and inner circumferences of the preheat ring 60 decenter with each other. In this case, the outer-inner diameter difference of the preheat ring 60 is not constant (in other words, it varies) radially, which provides a gap longer than the gap width $w_1$ between the susceptor 20 and the preheat ring 60.

In this case, the outer circumferential radius $R_1$ and the inner circumferential radius $R_2$ of the preheat ring 60 may be about 220-224 mm and about 187-191 mm, respectively. Further, the distance between the center point $P_1$ of the outer circumference and the center point $P_2$ of the inner circumference may be about 1-3 mm. In the example in FIG. 3, the maximum and minimum values of the gap width between the susceptor 20 and the preheat ring 60 are $w_2$ and $w_1$, respectively. The minimum gap width $w_1$ of 1 mm or longer is preferred in order to prevent generation of particles due to a contact of the susceptor 20 and the preheat ring 60 while the susceptor 20 rotates radially during an epitaxial growth. On the other hand, for reducing a blowup of the atmospheric gas $G_A$ in the vicinity of the reactant gas inlet, the maximum gap width $w_2$ is preferably 3 mm or longer.

Figure 7A:
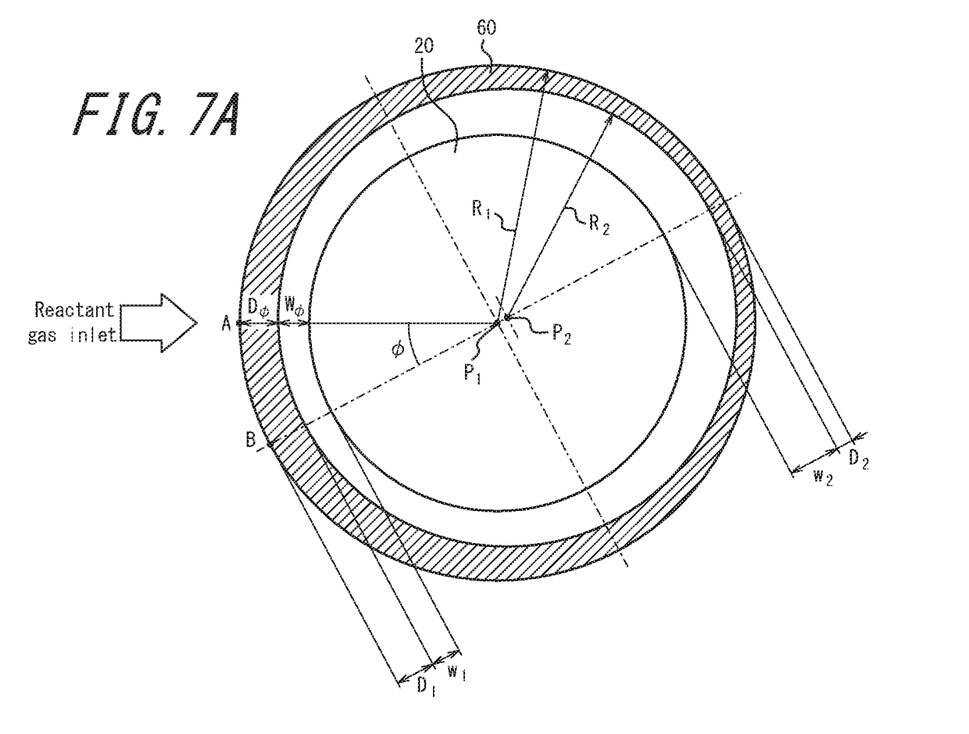
FIG. 7A is a schematic diagram indicating the relationship between an angle φ and a deviation in the thickness profile of the epitaxial layer in Experimental Example 3.

Further, as depicted in FIG. 7A that will be described later, an angle φ about the center point P1 of the outer circumference between a point A closest to the reactant gas inlet and a position B where the gap width is the shortest is no smaller than −40° and less than 0° where angles in a direction of a rotation of the susceptor are defined as positive angles.

Figure 4A:
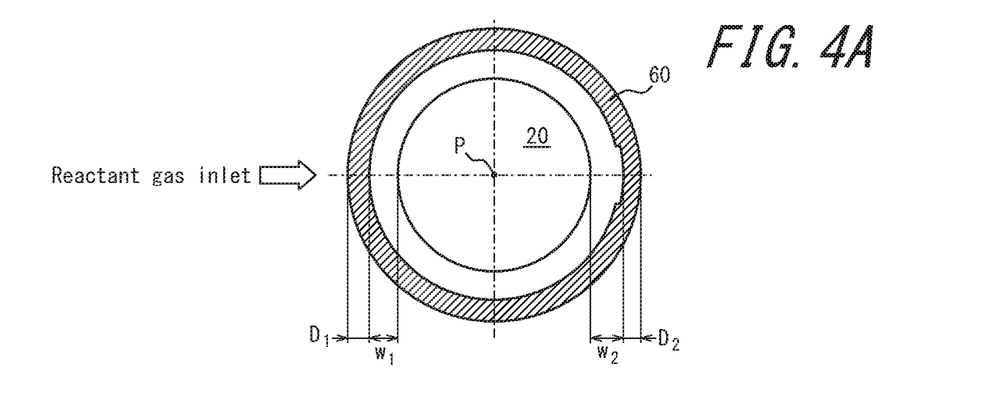
FIG. 4A is a schematic plan view illustrating a preferred mode of a preheat ring in the epitaxial growth apparatus according to an embodiment of the present disclosure.

Further, as depicted in FIG. 4A, preferably, a notch is provided at the inner circumference of the preheat ring 60. In the example in FIG. 4A, although the center points P of the outer and inner circumferences of the preheat ring 60 coincide with each other, the provision of the notch provides the gap width $w_2$ at the position opposite to the reactant gas inlet, which is longer than the gap width $w_1$ in the vicinity of the reactant gas inlet. For example, the gap width $w_2$ in the vicinity of the notch may be about 3-10 mm, and the gap width $w_1$ in the vicinity of the reactant gas inlet may be about 1-3 mm. Further, the outer-inner diameter difference $D_2$ in the vicinity of the notch may be about 29-33 mm, and the outer-inner diameter difference $D_1$ in the vicinity of the reactant gas inlet may be about 33-34 mm. In this case, since the notch intensifies a blowup of the atmospheric gas, which contributes to reduce a blowup of the atmospheric gas in the vicinity of the reactant gas inlet.

Figure 4B:
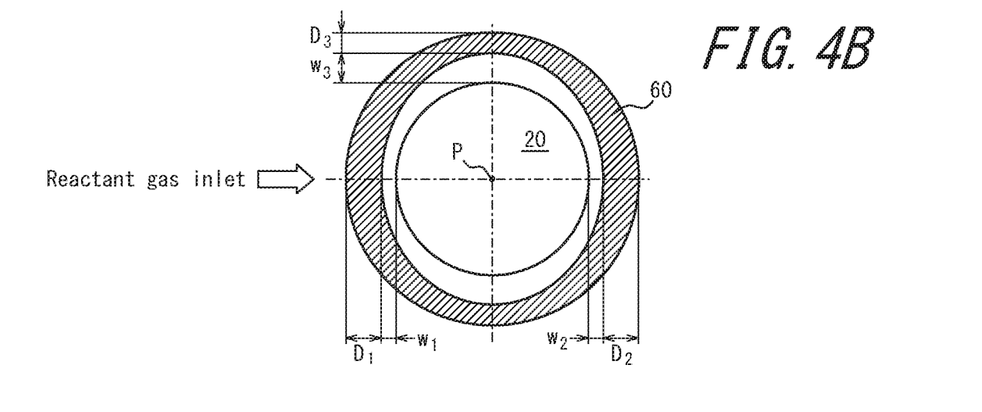
FIG. 4B is a schematic plan view illustrating a preferred mode of a preheat ring in the epitaxial growth apparatus according to another embodiment of the present disclosure.

Alternatively, as depicted in FIG. 4B, it is also preferred that the outer circumference of the preheat ring 60 has a circular shape and the inner circumference of the preheat ring 60 has an elliptic shape. Although the center points P of the outer and inner circumferences of the preheat ring 60 coincide with each other in the example in FIG. 4B, the short axis of the elliptic inner circumference extends along the direction of the flow of the reactant gas and the long axis of the elliptic inner circumference extends along the direction perpendicular to the flow of the reactant gas. In this case, the gap widths $w_1$ and $w_2$ in the direction of the flow of the reactant gas may be about 1-3 mm, and the gap width $w_3$ ($W_{90°}$) at the region perpendicular to the direction of the flow of the reactant gas may be about 3-10 mm. Further, the outer-inner diameter differences $D_1$ and $D_2$ in the direction of the flow of the reactant gas may be about 33-34 mm, and the outer-inner diameter difference $D_3$ ($D_{90°}$) at the region perpendicular to the direction of the flow of the reactant gas may be about 29-33 mm. In this case, a blowup of the atmospheric gas intensifies on the sides of the long axis of the preheat ring 60, which contributes to reduce a blowup of the atmospheric gas in the vicinity of the reactant gas inlet.

Figure 4C:
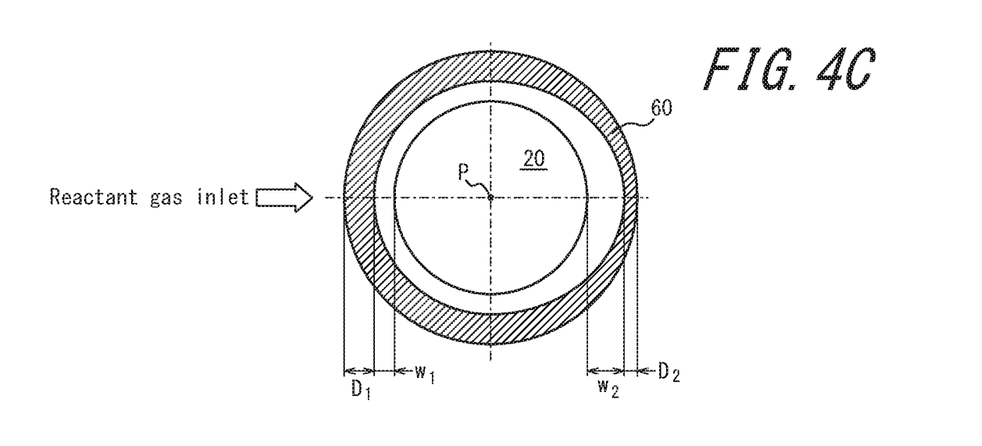
FIG. 4C is a schematic plan view illustrating a preferred mode of a preheat ring in the epitaxial growth apparatus according to still another embodiment of the present disclosure.

Still alternatively, as depicted in FIG. 4C, it is also preferred that the outer circumference of the preheat ring 60 has a circular shape and the inner circumference has a non-circular shape. In the example in FIG. 4C, although the center points P of the outer and inner circumferences of the preheat ring 60 coincide with each other, the inner circumference in the left half of the drawing has a circular shape and the shape of the inner circumference in the right half is partially elliptic. The gap width $w_2$ at the position opposite to the reactant gas inlet is set to be longer than the gap width $w_1$ in the vicinity of the reactant gas inlet. In the case of this example, a blowup of the atmospheric gas is also intensified in the vicinity of the elliptic inner circumference, which contributes to reduce a blowup of the atmospheric gas in the vicinity of the reactant gas inlet. In the case of FIG. 4C, the gap width $w_2$ may be about 3-15 mm, and the gap width $w_1$ may be about 1-3 mm. Furthermore, the outer-inner diameter difference $D_2$ may be about 26-33 mm, and the outer-inner diameter difference $D_1$ may be about 33-34 mm. Alternatively, although only the right half of the inner circumference has an elliptic outline in the drawing in FIG. 4C, an oval or parabolic shape or non-circular shape may be provided anywhere except for the vicinity of the reactant gas inlet.

Various preferred modes of the preheat ring 60 have been described. However, as long as a gap width longer than the gap width between the susceptor 20 and the preheat ring 60 in the vicinity of the reactant gas inlet, is provided at least in part between the susceptor 20 and the preheat ring 60, a blowup of the atmospheric gas in the vicinity of the reactant gas inlet is reduced, as described above, which contributes to an improved film thickness uniformity of the epitaxial layer.

In this embodiment, the preheat ring 60 preferably has an annular structure having a continuous curved structure, as described above with reference to FIGS. 3 and 4A-4C, and other drawings or descriptions.

In the epitaxial growth apparatus according to this embodiment, a silicon wafer is preferably used as the semiconductor wafer W, and an epitaxial layer to be formed on the silicon wafer is preferably a silicon epitaxial layer. The epitaxial growth apparatus according to this embodiment, however, is also applicable to compound semiconductor wafers, and is also applicable to hetero epitaxial growths.

Further, the epitaxial growth apparatus according to this embodiment may have a susceptor support shaft, lift pins, a lift shaft, and heating lamps, which will be discussed, and any other elements typically used in epitaxial growth apparatuses. This embodiment is not limited to these specific modes.

<Susceptor Support Shaft>

The susceptor support shaft 30 supports the susceptor 20 from below inside the chamber 10, and the supporting shaft thereof is approximately coaxial with the center of the susceptor 20.

<Lift Pins>

The lift pins 40A, 40B, and 40C pass through the respective through-holes in the susceptor 20. While the lift pins 40A, 40B, and 40C are moved upward or downward by the lift shaft 50, top ends of the lift pins 40A, 40B, and 40C support the semiconductor wafer W (50% or more in radius of the backside of the semiconductor wafer W). The upward or downward movement of the lift pins 40A, 40B, and 40C causes the semiconductor wafer W to be placed on or removed from the susceptor 20. The details of the movements will be also described later. Similarly to the susceptor 20, carbon graphite and/or silicon carbide is generally used as the material of the lift pins 40A, 40B, and 40C.

<Lift Shaft>

The lift shaft 50 has hollow space that accommodates a main shaft of the susceptor support shaft 30, and the end of the supporting shaft is configured to support the bottom ends of the lift pins. The lift shaft 50 is preferably made from quartz. An upward or downward movement of the lift shaft causes the lift pins 40A, 40B, and 40C to be moved upward or downward along the main shaft of the susceptor support shaft 30.

<Heating Lamps>

Heating lamps are disposed in the upper and lower regions of the chamber 10, and generally halogen or infrared lamps are used which have higher temperature elevation rates and superior temperature controllabilities.

(Preheat Ring)

According to an embodiment of the present disclosure, the preheat ring is a preheat ring that surrounds the side of the susceptor for mounting a semiconductor wafer inside an epitaxial growth apparatus, having a gap interposed between the preheat ring and the susceptor. The outer-inner diameter difference of the preheat ring varies radially. Usage of such a preheat ring in an epitaxial growth apparatus can reduce a blowup of the atmospheric gas in the vicinity of the reactant gas inlet for epitaxy, as described above, which contributes to an improved film thickness uniformity of an epitaxial layer. Although preferred modes of such a preheat ring will be described referring to the aforementioned FIGS. 3 and 4, any duplications to the descriptions of an embodiment of the epitaxial growth apparatus are omitted.

As depicted in FIG. 3, the outer and inner peripheries of the preheat ring 60 preferably have circular shapes of different diameters, and the center points $P_1$ and $P_2$ of the outer and inner peripheries preferably do not coincide with each other. Further, as depicted in FIG. 4A, the inner periphery of the preheat ring 60 is preferably provided with a notch. Still further, preferably, the outer periphery of the preheat ring 60 has a circular shape, and the inner periphery of the preheat ring 60 has an elliptic shape.

Furthermore, a method of manufacturing an epitaxial wafer according to an embodiment of the present disclosure includes supplying an atmospheric gas and a reactant gas containing hydrogen gas as a carrier gas to the epitaxial growth apparatus described above or an epitaxial growth apparatus including the epitaxial growth apparatus described above to epitaxially grow an epitaxial layer on a semiconductor wafer. This can reduce a blowup of the atmospheric gas in the vicinity of the reactant gas inlet for epitaxy, as described above.

Note that the flow rate for supplying the reactant gas including hydrogen gas as a carrier gas may be 5-100 SLM, the flow rate for supplying the atmospheric gas may be 1-50 SLM Hydrogen gas is preferably used as the carrier gas, and dichlorosilane or trichlorosilane is preferably used as a silicon source gas. Hydrogen gas is preferably used as the atmospheric gas. A silicon wafer is preferably used as the semiconductor wafer W, and the epitaxial layer to be formed on the silicon wafer is preferably a silicon epitaxial layer.

EXAMPLES

Although the following examples will be described for providing the advantageous effects of the present disclosure more clearly, the present disclosure is not limited to these examples.

Experimental Example 1

Example 1

The preheat ring 60 depicted in FIG. 3 was installed in an epitaxial growth apparatus. In the manner similar to FIG. 3, the position with the shortest outer-inner diameter difference of the preheat ring 60 was provided in the vicinity of the reactant gas inlet and the position with the longest outer-inner diameter difference of the preheat ring 60 was provided in the vicinity of the reactant gas outlet. The distance between the center points $P_1$ and $P_2$ depicted in FIG. 3 was set to 1.5 mm, and the gap widths $w_1$ and $w_2$ between the susceptor 20 and the preheat ring 60 were set to 2 mm and 5 mm, respectively.

A boron doped silicon wafer W of a diameter of 300 mm was used as the silicon epitaxial wafer substrate. From this silicon wafer W, an epitaxial wafer was manufactured with the epitaxial growth apparatus according to Example 1. In order to manufacture the epitaxial wafer, initially, trichlorosilane gas as a raw material source gas was supplied at a temperature of 1130° C. and a silicon coating was provided on the surface of the susceptor 20. The silicon wafer W was then transferred to the epitaxial film formation chamber and was then mounted on the susceptor 20 with the lift pins. Thereafter, hydrogen gas was supplied at 1130° C. to carry out a hydrogen bake. A silicon epitaxial film was then grown to a thickness of 4 μm at 1130° C. to obtain an epitaxial silicon wafer. In this process, trichlorosilane, diborane, and hydrogen gases were used as the raw material source gas, the dopant gas, and the carrier gas, respectively. The total flow rate of the reactant gas $G_P$ (the total flow rate of the source gas and the carrier gas) was 70 SLM, and the flow rate of the atmospheric gas $G_A$ was 25 SLM.

Conventional Example

An epitaxial layer was formed in the manner similar to Example 1, except for the fact that a ring-shaped preheat ring that was point symmetric about a center point according to prior art was used in place of the preheat ring 60 in Example 1. Note that, in Conventional Example, the gap width between the preheat ring and the susceptor was about 3.5 mm and was constant radially.

<Evaluations: Measurements of Film Thicknesses of Epitaxial Layers>

Figure 5:
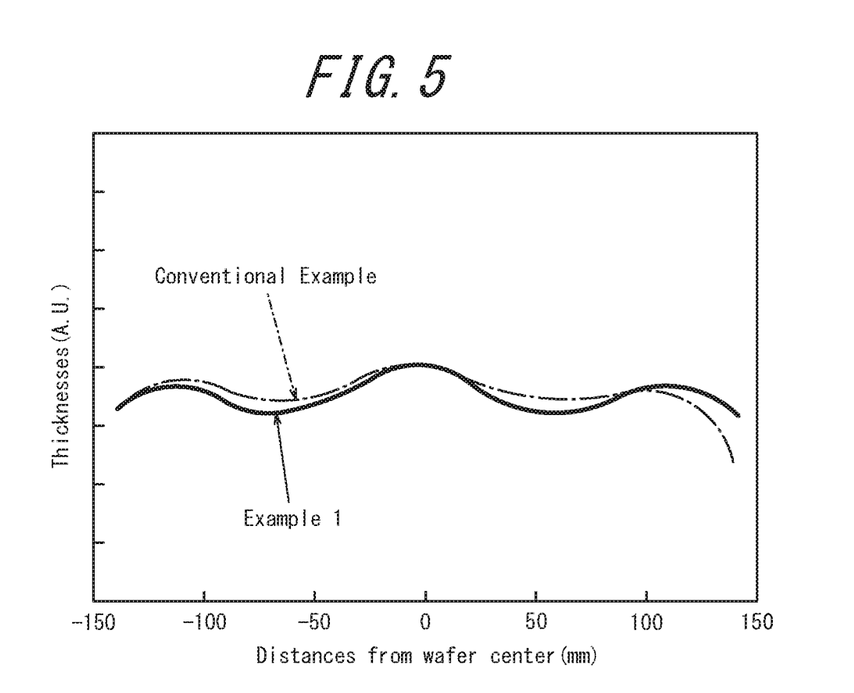
FIG. 5 is a graph indicating the film thickness uniformity of an epitaxial layer in Experimental Example 1.

An FT-IR film thickness meter (QS-3300EG manufactured by Nanometrics Incorporated) was used to determine film thickness profiles of the epitaxial films on the epitaxial wafers manufactured in Example 1 and Conventional Example. The results are illustrated in FIG. 5. The values on the vertical axis in the graph of FIG. 5 are relative values. FIG. 5 indicates that deviation in the thickness profile of the epitaxial wafer in the region external to 100 mm exhibited an approximately 58% improvement compared to that of Conventional Example. As used herein, the term "deviation" refers to deviation of values on the outer peripheral region of a wafer (the area other than the area within 100 mm in radius from the wafer center) measured with the above-described film thickness meter, and was determined by the following equation: {(maximum measurement value−minimum measurement value)/(maximum measurement value+minimum measurement value)}×100%. This was also used in the following Experimental Examples 2 and 3.

Experimental Example 2

Figure 6:
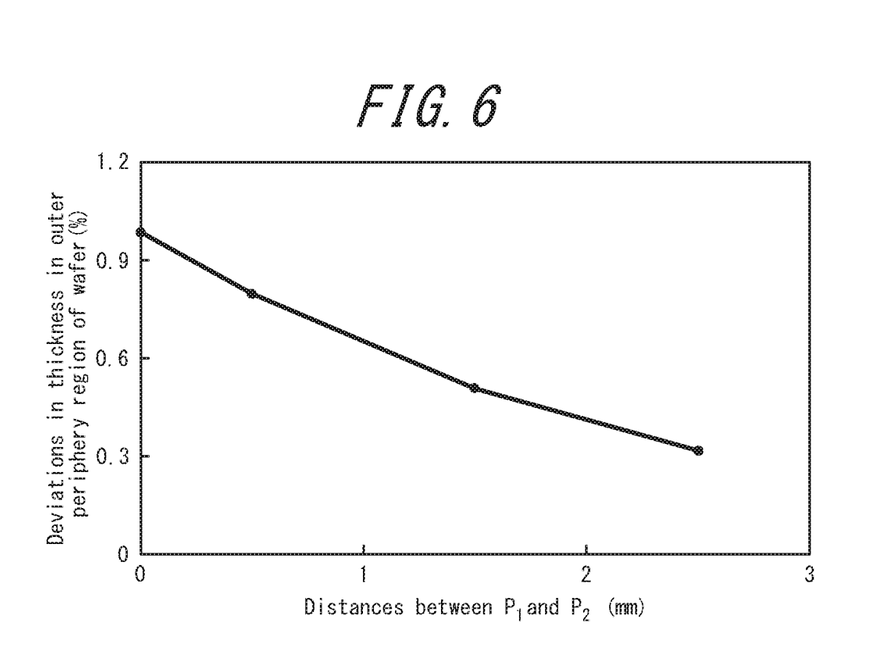
FIG. 6 is a graph indicating the relationship between distances between P1 and P2 and a deviation in the thickness profile of an epitaxial layer in Experimental Example 2.

A silicon epitaxial wafer was fabricated in the manner similar to the Example 1, except for the fact that the distance between the outer circumferential center point $P_1$ and the inner circumferential center point $P^2$ was modified, but the same outer and inner circumferential radii $R_1$ and $R_2$ of the preheat ring as those in Example 1 were used. The relationship between the distances between the outer and inner circumferential center points $P_1$ and $P_2$, and a deviation in the thickness profile is indicated in FIG. 6. An epitaxial growth did not take place normally when the distance between the outer and inner circumferential center points $P_1$ and $P_2$ was 3 mm or longer because $w_1$ became almost zero and the preheat ring contacted the susceptor.

FIG. 6 indicates that a wider $w_2$ in Example 1 exhibited a more improved deviation in the film thickness profile in the outer periphery region as compared to Conventional Example, as long as $w_1$ was no less than 1 mm. Particularly, it was confirmed that the distance between the outer and inner circumferential center points $P_1$ and $P_2$ of 1 mm or longer reduced the deviation to 0.6% or below. It is understood that the epitaxial apparatus according to the conditions of the present disclosure reduced a blowup of the atmospheric gas in the vicinity of the reactant gas inlet in an epitaxial apparatus, which contributed to improving the film thickness uniformity.

Experimental Example 3

As depicted in FIG. 7A, a silicon epitaxial wafer was fabricated in the manner similar to the Example 1, except for the fact that the angle φ about the outer circumferential center point $P_1$ between the point A closest to the reactant gas inlet and the position B where the gap width between the preheat ring 60 and the susceptor 20 was the shortest, was shifted (an angle φ of 0° was used in Example 1), while the same outer and inner circumferential radii $R_1$ and $R_2$ of the preheat ring in Example 1 were used. For the sake of brevity of descriptions, the reference symbols $w_1$ (minimum gap width) and $w_2$ (maximum gap width) used in FIG. 3 are also used in FIG. 7A for illustrating the positional relationship for providing clearer contrasts. Thus, the gap width $w_\varphi$ between the preheat ring 60 and the susceptor 20 at the point A closest to the reactant gas inlet satisfied the inequality: $w_1 < w_\varphi < w_2$. As for the angle φ, negative values of the angle φ represent angles shifted in the counterclockwise direction from the base point A toward the position B where the gap width was the shortest, whereas positive values of the angle φ represent angles shifted in the clockwise direction from the base point A toward the position B of the shortest gap width. Unlike Experimental Example 2, the distance between the outer and inner circumferential center points $P_1$ and $P_2$ was maintained to 1.5 mm.

Figure 7B:
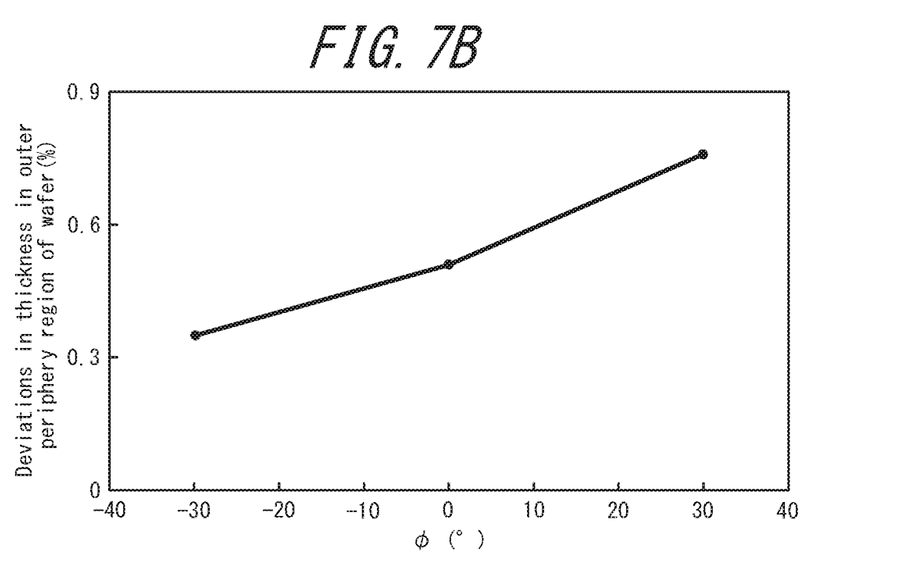
FIG. 7B is a graph indicating the relationship between angles φ and a deviation in the thickness profile of the epitaxial layer in Experimental Example 3.

FIG. 7B illustrates the relationship between the angles φ and a deviation in the thickness profile. The deviation remained within 0.8% when the angle φ about the center point P1 between the base point A in the vicinity of the reactant gas inlet and the position B having the shortest gap width was within ±45°. Thus, FIG. 7B suggests that the deviation in the thickness profile could be reduced when the angle φ was in a range within ±45°. Particularly, the angle φ from −40° to +15° gave a deviation in the thickness profile of 0.6% or lower, indicating high advantageous effects. It was also indicated that the angles φ of less than 0° provided further advantageous effects. The rotations of the susceptor in the clockwise direction was considered as one of the reasons why FIG. 7B is not symmetric with respect to an and φ of 0°.

INDUSTRIAL APPLICABILITY

In accordance with the present disclosure, an epitaxial growth apparatus that can provide an improved thickness uniformity of an epitaxial film is provided.

REFERENCE SIGNS LIST 100 epitaxial growth apparatus
10 chamber
11 upper dome
12 lower dome
13 dome base
14 heating lamp
15A reactant gas inlet
15B atmospheric gas inlet
16A reactant gas outlet
16B atmospheric gas outlet
17 upper liner
18 lower liner
20 susceptor
30 susceptor support shaft
40A, 40C lift pin
50 lift shaft
60 preheat ring
W semiconductor wafer

The invention claimed is:

1. An epitaxial growth apparatus used for a vapor phase growth of an epitaxial film on a surface of a semiconductor wafer, the epitaxial growth apparatus comprising:
a chamber,
a susceptor for mounting the semiconductor wafer inside the chamber;
a preheat ring surrounding a side of the susceptor having a gap interposed therebetween; and
a reactant gas inlet for supplying a reactant gas for the vapor phase growth of an epitaxial layer, to a front surface of the semiconductor wafer,
wherein:
a width of the gap at least in part between the susceptor and the preheat ring is set to be longer than the width of the gap between the susceptor and the preheat ring in a vicinity of the reactant gas inlet;
a difference between outer and inner diameters of the preheat ring varies radially around the preheat ring;
outer and inner circumferences of the preheat rings have circular shapes of different diameters, and center points of the outer and inner circumferences do not coincide with each other; and
an angle about the center point of the outer circumference between a point closest to the reactant gas inlet and a position where the width of the gap is the shortest is no smaller than −40° and less than 0° where angles in a direction of a rotation of the susceptor are defined as positive angles.

2. The epitaxial growth apparatus according to claim 1, wherein the inner circumference of the preheat ring is provided with a notch.

3. The epitaxial growth apparatus according to claim 1, wherein the outer circumference of the preheat ring has a circular shape, and the inner circumference of the preheat ring has an elliptic shape.

4. The epitaxial growth apparatus according to claim 1, wherein the preheat ring has an annular structure.

5. A preheat ring for surrounding a side of a susceptor for mounting a semiconductor wafer, having a gap interposed between the preheat ring and the susceptor, inside an epitaxial growth apparatus,
wherein:
a difference between outer and inner diameters of the preheat ring varies radially around the preheat ring;
outer and inner circumferences of the preheat ring have circular shapes of different diameters, and center points of the outer and inner circumferences do not coincide with each other; and
an angle about a center of the outer circumference between a point closest to the reactant gas inlet and a position where the width of the gap is the shortest is no smaller than −40° and less than 0° where angles in a direction of a rotation of the susceptor are defined as positive angles.

6. The preheat ring according to claim 5, wherein the inner circumference of the preheat ring is provided with a notch.

7. The preheat ring according to claim 5, wherein the outer circumference of the preheat ring has a circular shape, and the inner circumference of the preheat ring has an elliptic shape.

8. The preheat ring according to claim 5, wherein the preheat ring has an annular structure.

9. A method of manufacturing an epitaxial wafer comprising:
supplying an atmospheric gas and a reactant gas containing hydrogen gas as a carrier gas to the epitaxial growth apparatus according to claim 1 to epitaxially grow an epitaxial layer on a semiconductor wafer.

10. A method of manufacturing an epitaxial wafer comprising:
supplying an atmospheric gas and a reactant gas containing hydrogen gas as a carrier gas to an epitaxial growth apparatus comprising the preheat ring according to claim 5 to epitaxially grow an epitaxial layer on a semiconductor wafer.

11. An epitaxial growth apparatus used for a vapor phase growth of an epitaxial film on a surface of a semiconductor wafer, the epitaxial growth apparatus comprising:
a chamber,
a susceptor for mounting the semiconductor wafer inside the chamber;
a preheat ring surrounding a side of the susceptor having a gap interposed therebetween; and
a reactant gas inlet for supplying a reactant gas for the vapor phase growth of an epitaxial layer, to a front surface of the semiconductor wafer,
wherein:
a width of the gap between the susceptor and the preheat ring in a vicinity of an opposite side to the reactant gas inlet is longer than the width of the gap between the susceptor and the preheat ring in the vicinity of the reactant gas inlet;
a difference between outer and inner diameters of the preheat ring varies radially around the preheat ring;
outer and inner circumferences of the preheat ring have circular shapes of different diameters, and center points of the outer and inner circumferences do not coincide with each other; and an angle about the center point of the outer circumference between a point closest to the reactant gas inlet and a position where the width of the gap is the shortest is no smaller than −40° and less than 0° where angles in a direction of a rotation of the susceptor are defined as positive angles.

* * * * *